(12) United States Patent
Schaefer

(10) Patent No.: US 6,246,225 B1
(45) Date of Patent: Jun. 12, 2001

(54) APPARATUS FOR DETECTING A COMPLETED ELECTRICAL CIRCUIT AND TESTING AN ELECTRICAL OUTPUT RECEPTACLE

(76) Inventor: John S. Schaefer, 10617-B Lanshire Dr., Austin, TX (US) 78758

( * ) Notice: Subject to any disclaimer, the term of this patent is extended or adjusted under 35 U.S.C. 154(b) by 0 days.

(21) Appl. No.: 09/332,481

(22) Filed: Jun. 14, 1999

(51) Int. Cl.[7] .................. G01R 19/145; G01R 19/00; G01R 31/00; G01R 31/02; G08H 3/00
(52) U.S. Cl. .................. 324/133; 324/508; 340/656; 340/651; 340/652
(58) Field of Search .................. 324/133, 508, 324/539, 538, 66; 340/656, 650, 651, 652

(56) References Cited

U.S. PATENT DOCUMENTS

| 3,514,552 | * | 5/1970 | Smith | 377/19 |
| 4,725,772 | * | 2/1988 | Peak | 324/66 |
| 4,734,651 | * | 3/1988 | Keller et al. | 324/538 |
| 4,816,746 | * | 3/1989 | Peak | 324/66 |
| 4,870,343 | * | 9/1989 | Dooley et al. | 324/72.5 |
| 5,027,074 | * | 6/1991 | Haferstat | 324/539 |
| 5,331,283 | * | 7/1994 | Sheldon | 324/508 |

FOREIGN PATENT DOCUMENTS

2189613 * 10/1987 (GB) .................. 31/2

* cited by examiner

Primary Examiner—Glenn W. Brown
Assistant Examiner—Wasseem H. Hamdan
(74) Attorney, Agent, or Firm—Rick B. Yeager

(57) ABSTRACT

A self-contained unit intended primarily for tracing the circuit connection between an electrical outlet or lighting receptacle and its corresponding circuit-breaker. The preferred embodiment includes a housing, a male two prong electrical plug, and a sound-producing means. A second embodiment includes a male three prong electrical plug. A third embodiment incorporates a momentary switch which permits testing of a ground fault interrupt across either a hot wire and a neutral, or across a hot wire and the ground. Adapters are used to temporarily adapt bare wires or a lighting receptacle to a female plug so that the device may be used.

6 Claims, 5 Drawing Sheets

APPARATUS FOR DETECTING A COMPLETED ELECTRICAL CIRCUIT AND TESTING AN ELECTRICAL OUTPUT RECEPTACLE

FIELD OF THE INVENTION

The present invention relates generally to the testing of electrical receptacles and, more particularly, to determining whether an output receptacle, a light fixture, or bare wires are "live".

DESCRIPTION OF THE PRIOR ART

U.S. Pat No. 5,331,283 entitled "Apparatus for detecting a completed electrical circuit at an electrical output receptacle" issued to Alan L. Sheldon on Jul. 19, 1994 describes an electrical test buzzer adapted for insertion into an output receptacle used to test for the presence of electricity at the output receptacle. The electrical test buzzer includes an audible alarm, a transformer held in a housing, and a pair of contact prongs. The contact prongs are inserted into an output receptacle causing the buzzer to sound a high pitched alarm when electricity is present at the receptacle. When no electricity is present at the receptacle, no circuit is formed, and the alarm does not sound. An object of the present invention is to provide a simple and inexpensive device, without the need for a transformer, that tests whether electricity is present at a circuit. It is a further object of the present invention to provide a simple test device that provides additional information about the electrical circuitry.

U.S. Pat. No. 4,725,772 entitled "Electrical circuit tester selectively responsive to either presence or absence of AC power" issued to Rex W. Peak on Feb. 16, 1988 relates to a means for testing electrical circuits to determine to which of a plurality of pre-wired circuits a particular outlet or other circuit point is connected, and to determine whether there is electrical continuity between a pair of conductors. The invention incorporates a battery, so that in one mode the tester will provide a positive signal in the absence of electrical power, and in another mode, the tester will provide a positive signal in the presence of electrical power.

The '283 patent summarizes prior art including U.S. Pat. No. 5,027,074 dated Jun. 25, 1991 which discloses a device for testing the individual conductors of a multi-conductor cable by transmitting pulses through each conductor, and then monitoring, processing and displaying the pulses U.S. Pat. No. 4,816,746 dated Mar. 28, 1989 which discloses a device which is connected to an existing electrical circuit to determine the presence of power across a pair of conductors where a switch is included to allow an alarm to sound when either power is present or when power is not present; U.S. Pat. No. 4,870,343 dated Sep. 26, 1989 which discloses a device for detecting the presence of a high voltage; U.S. Pat. No. 4,734,651 dated Mar. 29, 1988 which discloses a device for determining the electrical continuity between the terminals of a multi-contact electrical connector and the cores of insulated leads; and U.S. Pat. No. 3,514,552 which discloses an apparatus for checking the connection of wires within a circuit.

It is frequently desirable to determine whether electrical power is present in an outlet, lighting receptacle, or loose wires. A test for the presence of electrical power is generally conducted before attempting work on the circuit. The usual method for removing power from a circuit is to deliberately trip a circuit breaker for the appropriate circuit. Many situations arise which make it necessary to determine which circuit breaker is associated with a particular outlet. This identification can be a very time-consuming operation, especially when it must be performed by one person working alone. Frequently, the fuse box or circuit breakers are located at a considerable distance from the outlet of the circuit being traced, often on a different floor of the building. Many trips back and forth between the outlet and fuse/breaker box may be required before the proper circuit is identified.

For these reasons, it is desirable to have a simple, dependable audible test indicator that will provide a strong signal when power is present and which will not provide a signal when power is not present. An object of the present invention is to provide such a device, so that the device can be temporarily attached to an electrical circuit in order to provide a strong audible or vibration signal that can be perceived at a circuit breaker location. Thus the device can be used to assist the repair person in determining which circuit breaker switch is appropriate for turning off the flow of electricity to the receptacle or wires.

Another object is to provide an apparatus which is small, lightweight, portable, inexpensive and simple in both construction and operation. A further advantage is that only one hand is required to use the device.

It is another object of the present invention to provide a device which may be easily and efficiently manufactured and marketed.

SUMMARY OF THE INVENTION

The present invention, provides an electrical test buzzer adapted for insertion into an output receptacle and for testing for the presence of electricity at the output receptacle. The electrical test buzzer includes an audible alarm, and a pair of contact prongs which form a male electrical plug. In some embodiments, a ground prong is also present. The contact prongs are inserted into an output receptacle, causing the buzzer to sound a loud alarm when electricity is present at the outlet or receptacle. When no electricity is present at the receptacle no circuit is formed and the alarm does not sound. The methods of using the electrical test buzzer device may include adapting the device to loose wires with alligator clips, and adapting the device to a lighting receptacle with an adapter. Methods for increasing the effective range of the device include using an extension cord between the receptacle and the device, and using a walkie/talkie such as a baby monitor remote listening device.

In an alternate embodiment, a switch is provided to check for a voltage between either leg and the ground.

Variation in size, materials, shape, and use, are deemed readily apparent and obvious to those skilled in the art, and the invention is not limited to the specific embodiment described below. It will be obvious to those skilled in the art to substitute equivalent means for generating an audible signal and for adapting lighting receptacles and bare wires to the device.

DETAILED DESCRIPTION OF PREFERRED EMBODIMENT

Figure 1:
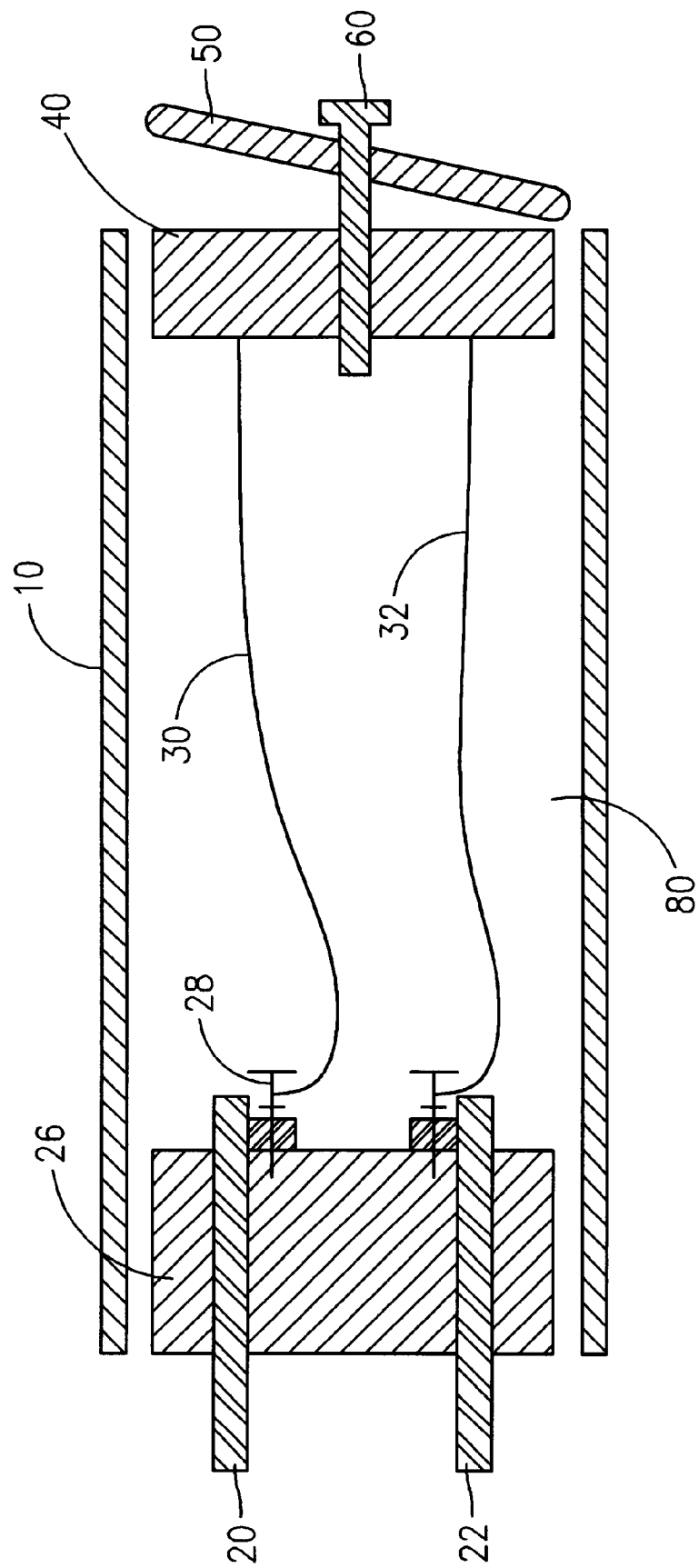
FIG. 1 is a cross-sectional view of a two prong plug

Referring now to FIG. 1 which is a cross-sectional view of the preferred embodiment of the two prong device, the device housing 10 is preferably a 1 inch PVC coupling. The housing contains a clapper assembly 40 with leads 30 and 32, such that the clapper makes an audible signal when a typical 110 volt differential is applied across the leads. The clapper disk 50 vibrates at a variable frequency as determined by the adjustment screw 60. The leads are connected to a two-prong plug assembly 26 which includes a first hot prong 20 and a second neutral prong 22. The prong assembly typically includes the prongs which are designed to be inserted into an electrical outlet; a plug housing, and a wire attachment means 28 for attaching electrical wires to the prongs. The wire attachment means is typically a screw assembly, but may be of equivalent functional design such as a wire insertion means or a wire solder design. The plug housing is preferably the same diameter is the inner diameter of the PVC coupling so that the plug housing fits snugly inside the coupling.

The device is assembled by securing the leads 30 and 32 to the respective wire attachment means so that one lead is attached to the hot prong and the other lead is attached to the neutral prong. It is desirable to cut the excess lead wires so that only about 3–4 inches of wire extends from the coupling when the clapper housing is inserted. This length provides sufficient lead wire to make the attachment to the plug assembly.

After the lead wires of the clapper assembly are connected to the plug assembly, the plug assembly is inserted into the coupling so that the plug housing is approximately flush with the end of the coupling. The device is then inverted so that the plug assembly is on the bottom, and a two-part epoxy 80 is then added to displace the remaining air volume within the shell. This epoxy may be pre-mixed, or it is possible to add the two components of the epoxy, and to mix the epoxy in place, inside the coupling. As the epoxy hardens, the epoxy provides electrical insulation and mechanical reinforcement to secure the plug assembly and the clapper assembly inside of the device housing.

Figure 2:
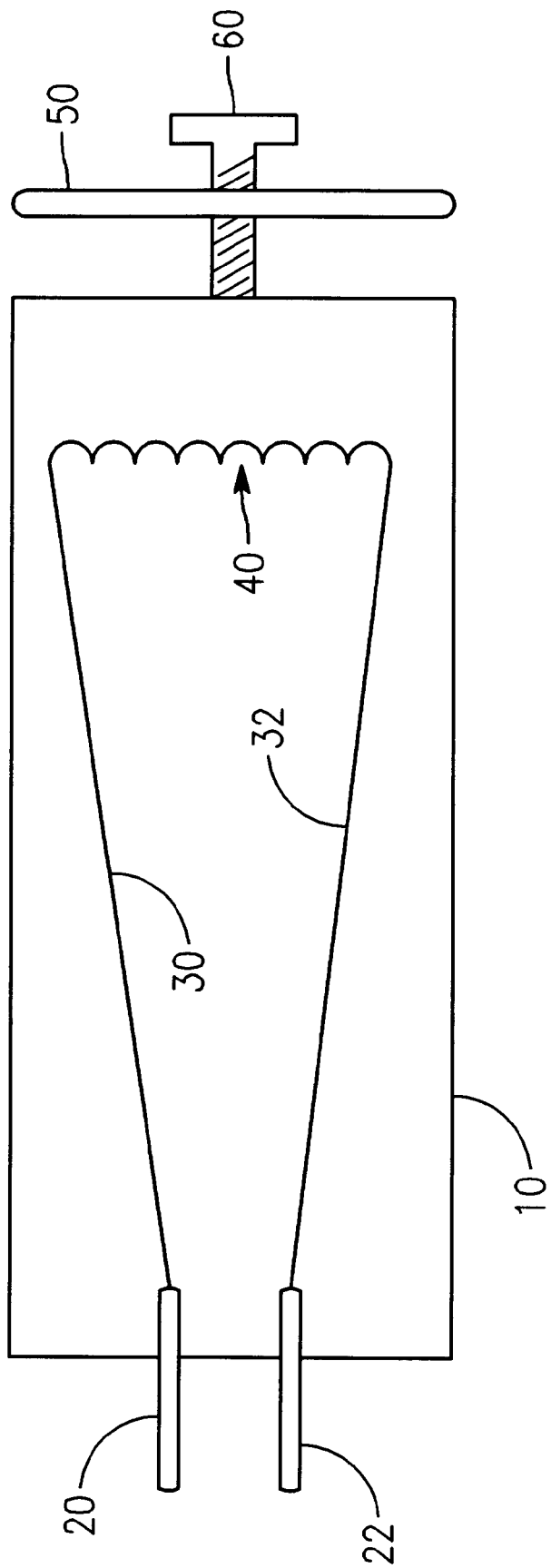
FIG. 2 is a schematic of a two prong device

Referring now to FIG. 2 which is a schematic of the two prong assembly, the hot prong 20 is connected to a first coil lead 30, and the neutral prong 22 is connected to the second prong lead 32. When the prongs are inserted into an electrical outlet, a current flows through the prongs and through the leads to the clapper coil 42, thereby causing the clapper disk 50 to vibrate. The noise or vibration generated by the clapper can be regulated by the audible adjusting screw 60. The preferred clapper assembly is an Edwards 120 vote 50–60 Hz and buzzer with leads, catalog No. 1066.

The preferred method of operating the device is to plug the device into an electrical outlet or receptacle, and then to locate the proper circuit which causes the power to stop buzzing or vibrating. This identification is typically performed by turning off one circuit breaker at a time and then listening for the clapper noise. Once the circuit is identified, the power should be turned on momentarily to verify that the sound is restored, and then turned off again to verify that the sound is not present. Before work is begun on the circuit, the outlet, receptacle, or wiring may be checked with another circuit tester. In the event that the electrical box is located in a position that makes it difficult to hear the clapper noise, it is possible to use a walkie-talkie or a baby monitor as a listening device. An alternative is to use an extension cord between the device and the outlet or receptacle so that the device may be placed within earshot of the circuit box.

The device may be used to test lighting outlets through the use of screw-in lamp threaded receptacle adapter which includes a female electrical receptacle and a male lighting adapter. When the adapter is screwed into a lighting socket, and the device is plugged into the electrical receptacle, the device will function in a manner similar to its wall plug embodiment. The clapper will generate noise and vibration when electricity is present at the lighting socket.

The device may also be used to test bare circuit wires through the use of a standard pigtail or alligator clip adapter which includes a female electrical receptacle and wire leads with alligator clips. The preferred adapter provides both a screw-in adapter and wire leads. When the adapter is clipped to live conductors, and the device is plugged into the electrical receptacle, the device will function in a manner similar to its wall plug embodiment. The clapper will generate noise and vibration when a voltage is present across the conductors.

Alternate Embodiment—Three Prong Device

Figure 3:
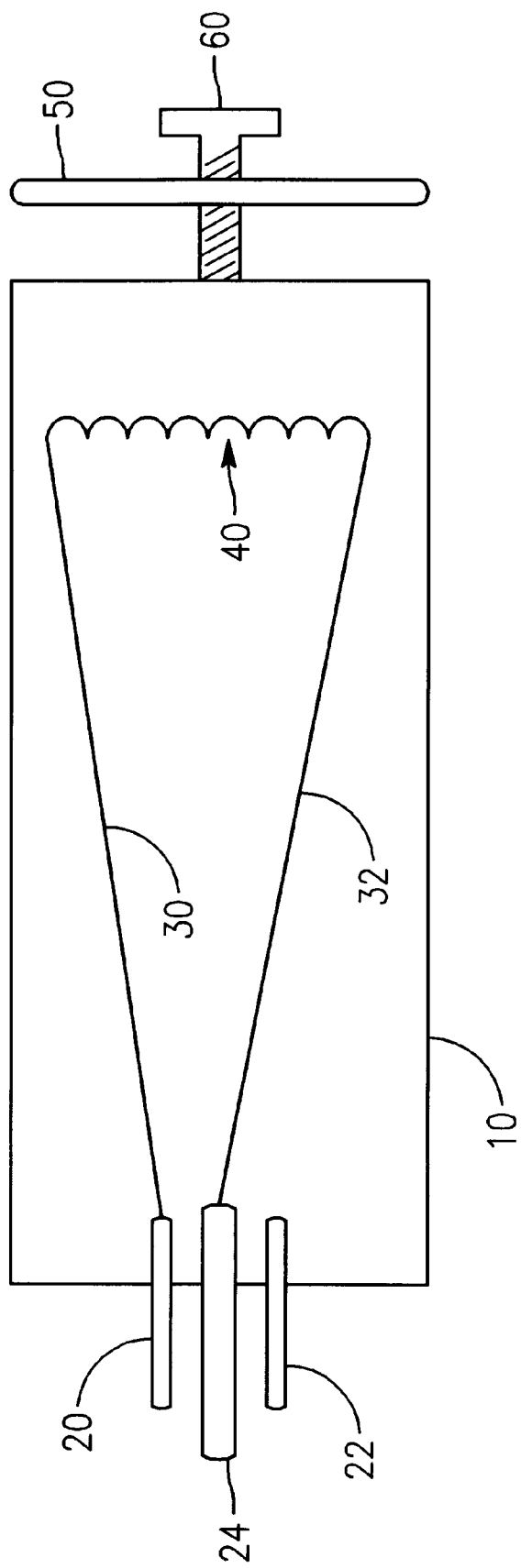
FIG. 3 is a schematic of a three prong device

Referring now to FIG. 3, which is a schematic of a three prong grounded plug device, the electrical schematic is similar to that of the two prong device, except that the clapper leads 30 and 32 are connected to the hot prong 20 and the ground prong 24. In this embodiment there is no electrical connection to the neutral prong.

Alternate Embodiment—Three Prong Device With Ground Fault Interrupt Test Button

Figure 4:
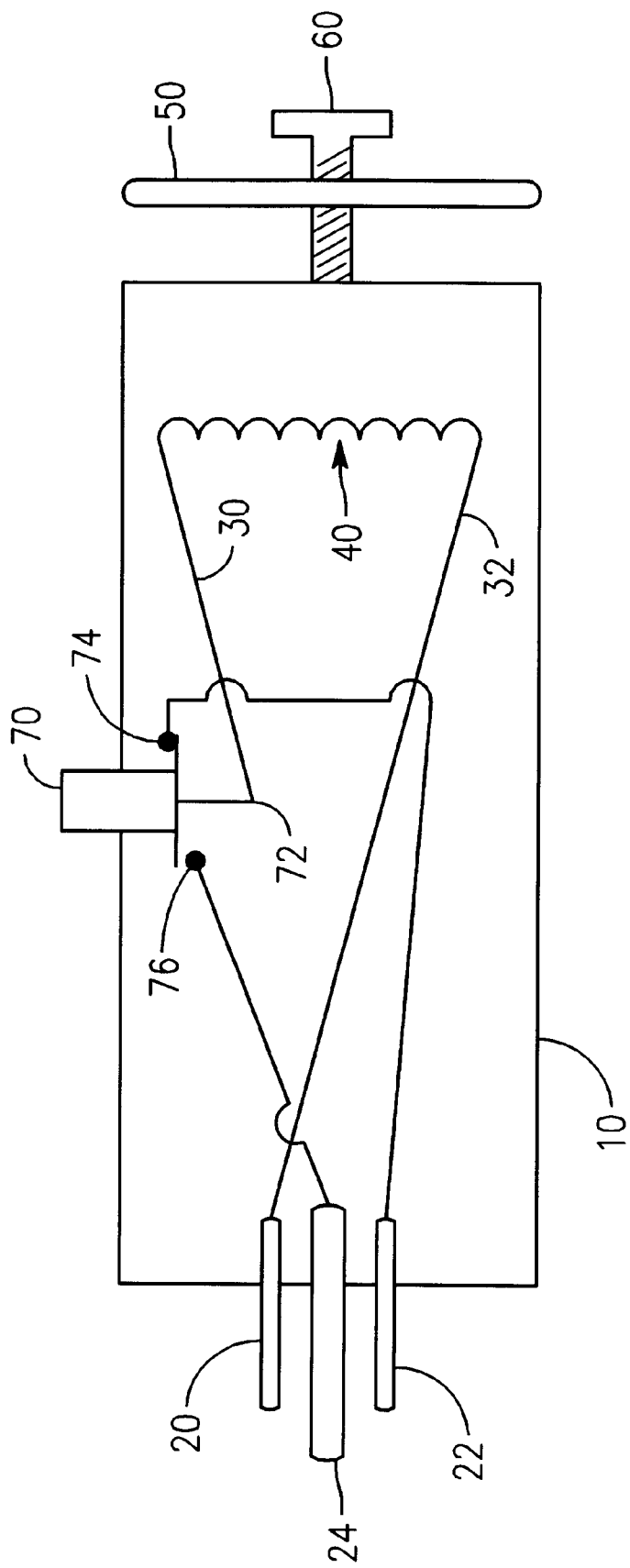
FIG. 4 is a schematic of a three prong device with ground fault test button

Referring now to FIG. 4, which is an electrical schematic of a three prong device with a ground fault interrupt test button, this embodiment incorporates a housing 10, a clapper assembly coil 40, a clapper disc 50, a clapper adjustment screw 60 to raise or lower the volume of the audible signal, and an electrical connection 72 between the first coil lead 30 and a momentary switch 70, such that in the normally-closed position a first switch contact 74 is connected to the neutral prong 22. The hot prong 20 is connected to a coil clapper lead 32 at all times. In the normally closed switch position, an electrical current flows from the neutral prong 22 through the switch contact 74 to a second clapper lead 30.

When the switch is depressed to its open position, the first switch contact 74 is disengaged, and a second switch contact 76 is engaged. The second switch contact 76 is connected to the ground prong 24. In the closed switch position, an electrical current may flow from the ground prong 24 through the switch contact 76 to a second clapper lead 30.

Thus, in the normally closed position, the switch permits a current to flow from the hot prong 20 through the clapper to the neutral prong 22, while in the open position, the switch permits a current to flow from the hot prong 20 through the clapper to the ground position 24. In the event that a ground fault interrupt is installed in the circuit, but not functioning properly, the clapper will emit a noise and vibration, which is an indication that there is a problem the ground fault interrupt. If there is no ground fault interrupt installed in the circuit, the device will emit a noise and vibration. If there is a ground fault interrupt in the circuit, the device will cause a good ground fault interrupt to trip. The preferred method of installing the momentary switch is to drill a ½ inch hole in the device housing, and to place the switch from inside of the shell. In the preferred method of construction, the switch is secured by the epoxy fill material. Alternately, the switch may be secured to the housing by screws or other attachment means.

Figure 5:
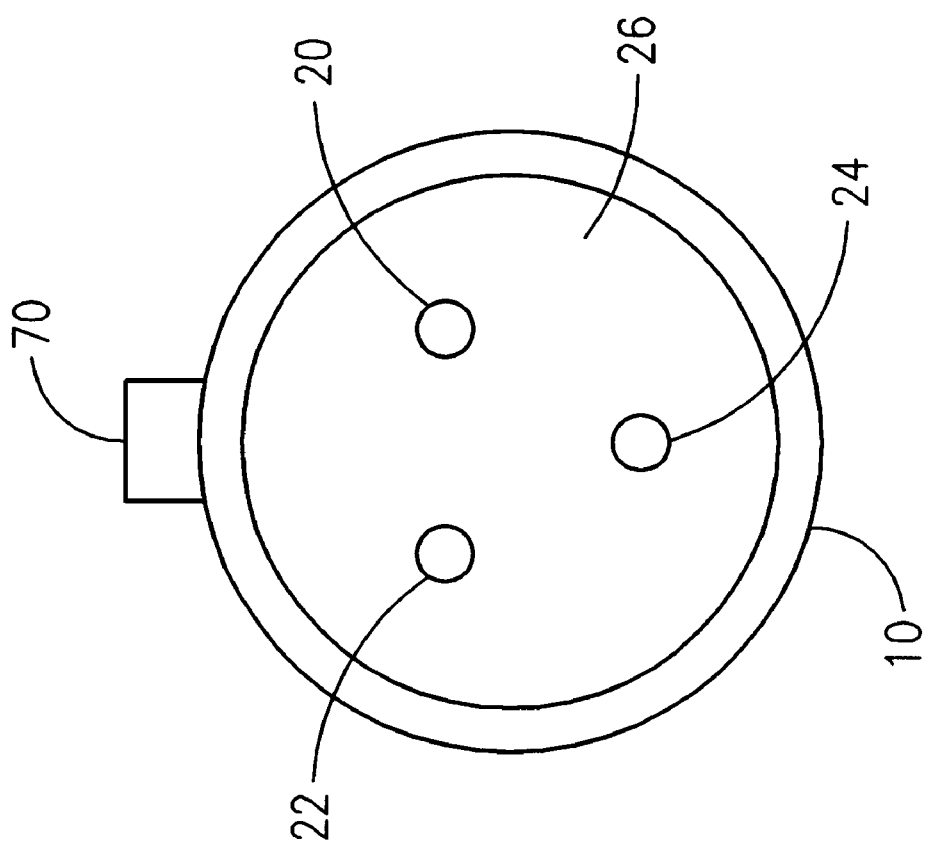
FIG. 5 is a front view of a three prong device with ground fault test button

Referring now to FIG. 5, which is front view of a three prong device with a ground fault interrupt test button, the device housing 10 protects the plug assembly 26 which includes the hot prong 20, the neutral prong 22, and the ground prong 24. The button for the momentary switch 70 is shown at the top of the device.

The preferred three prong plug is a Leviton three prong No. 1515, 120 volt plug. It may be necessary clip the leads of the plug before inserting the plug into the coupling. The preferred switch is a No. 2 G. C. S/P DT momentary switch, catalog No. 35–416. It is generally desirable to remove the lock nut from the switch when using epoxy fill in order to simplify the assembly. The preferred two prong plug is a Leviton No. 515, 120 volt plug. The preferred epoxy is a clear quick set two-part mixture. For low production volume, it is possible to mix equal portions of the epoxy components within the shell internal area, so as to minimize waste of the epoxy. The preferred clapper assembly is an Edwards 120 vote 50–60 Hz and buzzer with leads, catalog No. 1066.

What is claimed is:

1. An electrical circuit tester for temporary connection across a group of conductors to determine whether AC power is present, the tester comprising:
    a housing;
    an electrical prong assembly, integral to the housing, the assembly having a first electrical prong, a second electrical prong, and a third electrical prong, such that the assembly may be inserted into a female electrical receptacle, and such that the first electrical prong is associated with the hot wire of a single phase electrical circuit, the second electrical prong is associated with the neutral wire of a single phase electrical circuit, and the third electrical prong is associated with the ground wire of a single phase electrical circuit;
    a clapper, integral to the housing, such that the clapper is electrically connected to the first electrical prong and the third electrical prong, such that the clapper is activated when electric current directly flows between the first electrical prong and the third electrical prong, so that a transformer is not required to activate the clapper; and
    an adjusting means, such that the adjusting means may raise or lower the volume of the clapper.

2. The electrical circuit tester of claim 1 wherein
    the housing is substantially filled with an electrically insulating epoxy.

3. An electrical circuit tester for temporary connection across a group of conductors to determine whether AC power is present, the tester comprising:
    a housing;
    the electrical prong assembly, integral to the housing, having a first electrical prong, a second electrical prong, and a third electrical prong such that the first electrical prong is associated with the hot wire of a single phase electrical circuit, the second electrical prong is associated with the neutral wire of a single phase electrical circuit, and the third electrical prong is associated with the ground wire of a single phase electrical circuit;
    an electrically-activated audible signal means, integral to the housing, having a first electrical connection and a second electrical connection such that the audible signal means is activated when electric current flows between the first electrical connection and the second electrical connection; and
    a switching means, integral to the housing, having a first position and a second position, such that
        in the first switch position, the first electrical connection of the audible signal means is connected to first electrical prong, and the second electrical connection of the audible signal means is connected to second electrical prong, and
        in the second switch position, the first electrical connection of the audible signal means is connected to first electrical prong, and the second electrical connection of the audible signal means is connected to third electrical prong, thereby providing a test for proper functioning of a ground fault interrupt.

4. The electrical circuit tester of claim 3 wherein
    the electrically-activated audible signal means is a clapper.

5. The electrical circuit tester of claim 3 wherein
    there is an adjusting means, such that the adjusting means may raise or lower the volume of the electrically-activated audible signal means.

6. The electrical circuit tester of claim 3 wherein
    the housing is substantially filled with an electrically insulating epoxy.

* * * * *